(12) United States Patent
Zhang et al.

(10) Patent No.: US 7,444,880 B2
(45) Date of Patent: Nov. 4, 2008

(54) METHOD AND APPARATUS FOR MEASURING THE MECHANICAL RESPONSE OF MICRO-ELECTRO-MECHANICAL SYSTEMS

(75) Inventors: Rongjing Zhang, Pasadena, CA (US); Guruswami Ravichandran, Arcadia, CA (US); Doron Shilo, Pasadena, CA (US); Kaushik Bhattacharya, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 11/011,320

(22) Filed: Dec. 13, 2004

(65) Prior Publication Data

US 2005/0223810 A1    Oct. 13, 2005

Related U.S. Application Data

(60) Provisional application No. 60/529,014, filed on Dec. 12, 2003.

(51) Int. Cl.
*G01B 7/16* (2006.01)
(52) U.S. Cl. .................................................. 73/779
(58) Field of Classification Search ............ 73/777–779
See application file for complete search history.

(56) References Cited

U.S. PATENT DOCUMENTS

| | | | | |
|---|---|---|---|---|
| 4,655,086 A * | 4/1987 | Mielnicka-Pate et al. | ..... | 73/646 |
| 4,665,747 A * | 5/1987 | Muscatell | ..... | 73/386 |
| 4,691,559 A * | 9/1987 | Fischer | ..... | 73/81 |
| 4,791,940 A * | 12/1988 | Hirschfeld et al. | ..... | 600/589 |
| 4,830,563 A * | 5/1989 | Yeakle | ..... | 414/401 |
| 4,883,959 A * | 11/1989 | Hosoki et al. | ..... | 250/306 |
| 4,933,545 A * | 6/1990 | Saaski et al. | ..... | 250/227.14 |
| 5,670,712 A * | 9/1997 | Cleveland et al. | ..... | 73/105 |
| 5,705,741 A * | 1/1998 | Eaton et al. | ..... | 73/105 |
| 6,052,613 A * | 4/2000 | Takaki | ..... | 600/479 |
| 6,427,511 B1 * | 8/2002 | Kutschker et al. | ..... | 72/319 |
| 6,938,489 B2 * | 9/2005 | Esashi et al. | ..... | 73/704 |
| 2001/0050705 A1 * | 12/2001 | Hoen et al. | ..... | 347/85 |

OTHER PUBLICATIONS

Oliver, W.C., and Pharr, G.M., "An Improved Technique for Determining Hardness and Elastic Modulus Using Load and Displacement Sensing Indentation Experiments," J. Mater. Res., Jun. 1992, pp. 1564-1583, vol. 7, No. 6, Materials Research Society, USA.

Srikar, V. T., and Spearing, S. M., "A Critical Review of Microscale Mechanical Testing Methods Used in the Design of Microelectromechanical Systems," Exp. Mech., Sep. 2003, pp. 238-247, vol. 43, No. 3, Society for Experimental Mechanics, USA.

(Continued)

*Primary Examiner*—Max Noori
(74) *Attorney, Agent, or Firm*—Tope-McKay & Associates

(57) ABSTRACT

The present invention relates to the field measuring the mechanical response of micro-electro-mechanical systems. More specifically, the present invention pertains to a method and apparatus that allows the direct control of the load applied to a Micro-Electro-Mechanical System in order to measure the mechanical response. The system comprises a loading sub-system, a displacement measurement sub-system, and an optional observation sub-system.

9 Claims, 5 Drawing Sheets

OTHER PUBLICATIONS

Haque, M. A., and Saif, M. T. A., "A Review of MEMS-Based Microscale and Nanoscale Tensile and Bending Testing," Exp. Mech., Sep. 2003, pp. 248-255, vol. 43, No. 3, Society for Experimental Mechanics, USA.

Kraft, O., and Volkert, C. A., "Mechanical Testing of Thin Films and Small Structures," Adv. Eng. Mater., 2001, pp. 99-110, vol. 3, No. 3, Wiley-VCH Verlag GmbH, Germany.

Zhang, T. Y., Su, Y. J., Qian, C. F., Zhao, M. H., and Chen, L. Q., "Microbridge Testing of Silicon Nitride Thin Films Deposited on Silicon Wafer," Acta Mater., 2000, pp. 2843-2857, vol. 48, Elsevier Science Ltd., USA.

Vlassek, J. J., and Nix, W. D., "A New Bulge Test Technique for the Determination of Young's Modulus and Poisson's Ratio of Thin Films," J. Mater. Res., Dec. 1992, pp. 3242-3249, vol. 7, No. 12, Materials Research Society, USA.

Read, D. T., and Dally, J. W., "A New Method for Measuring the Strength and Ductility of Thin Films," J. Mater. Res., Jul. 1993, pp. 1542-1549, vol. 8, No. 7, Materials Research Society, USA.

Chasiotis, I., and Knauss, W., "A New Microtensile Tester for the Study of MEMS Materials with the Aid of Atomic Force Microscopy," Exp. Mech., Mar. 2002, pp. 51-57, vol. 42, No. 1, Society for Experimental Mechanics, USA.

Haque, M. A., and Saif, M. T. A., "In situ Tensile Testing of Nanoscale Specimens in SEM and TEM," Exp. Mech., Mar. 2002, pp. 123-128, vol. 42, No. 1, Society for Experimental Mechanics, USA.

Emery, R. D., and Povirk, G. L., 2003, "Tensile Behavior of Freestanding Gold Films. Part I. Coarse-Grained Films," Acta Mater., 2003, pp. 2067-2078, vol. 51, Elsevier Science Ltd., USA.

Espinosa, H. D., Prorok, B. C., and Fischer, M., "A Methodology for Determining Mechanical Properties of Freestanding Thin Films and MEMS Materials," J. Mech. Phys. Solids, 2003, pp. 47-67, vol. 51, Elsevier Science Ltd., USA.

Sharpe, W. N., and Gianola, D. S., "Techniques for Testing Thin Films in Tension," Exp. Tech., Sep./Oct. 2004, pp. 23-27, vol. 28, Society for Experimental Mechanics, USA.

Ruud. J. A., Josell, D., Spaepen, F., and Greer, A. L., "A New Method for Tensile Testing of Thin Films," J. Mater. Res., Jan. 1993, pp. 112-117, vol. 8, No. 1, Materials Research Society, USA.

Begley, M. R., and Mackin, T. J., "Spherical Indentation of Freestanding Circular Thin Films in the Membrane Regime," J. Mech. Phys. Solids, 2004, pp. 2005-2023, vol. 52, Elsevier Ltd., USA.

Zhang, Y., and Wise, K. D., "Performance of Non-Planar Silicon Diaphragms Under Large Deflections," J. Microelectromech. Syst., Jun. 1994, pp. 59-68, vol. 3, No. 2, IEEE, USA.

* cited by examiner

METHOD AND APPARATUS FOR MEASURING THE MECHANICAL RESPONSE OF MICRO-ELECTRO-MECHANICAL SYSTEMS

CROSS-REFERENCE TO RELEATED APPLICATIONS

The present application claims the benefit of priority of U.S. Provisional Patent Application No. 60/529,014, filed Dec. 12, 2003, and entitled "Instruments for Measuring the Mechanical Response of Micro Electrical-Mechanical Systems."

STATEMENT REGARDING FEDERALLY SPONSORED RESEARCH

The U.S. Government has certain rights in this invention pursuant to Grant No. DAAD19-01-1-5017 awarded by the Army Research Office (ARO).

BACKGROUND OF THE INVENTION (1) Field of the Invention

The present invention relates to the field measuring the mechanical response of micro-electro-mechanical systems. More specifically, the present invention pertains to a method and apparatus that allows the direct control of the load applied to a micro-electro-mechanical system in order to measure the mechanical response.

(2) Description of Related Art

The interest in micro-electro-mechanical systems (MEMS) has given rise to a necessity for developing new techniques for studying the mechanical response of structures with small dimensions, such as thin, free-standing films, membranes, and cantilevers. The trend to reduce the dimensions of these structures compels load sensitivity in the sub-milli-Newton scale at displacements in the sub-micrometer range, and the interest in characterizing active materials, such as ferroelectrics, ferromagnetics, and shape-memory alloys, requires dynamic measurements under load control. These requirements are not met by conventional techniques.

Previously, tensile tests have been used to determine the mechanical properties of structural materials. The American Society for Testing and Materials (ASTM) dictates a tensile test as the standard for determining the mechanical properties of structural materials. While uniaxial and uniform stress and stain fields can be measured directly using tensile tests, at the micrometer scale tensile tests are difficult and expensive.

Another conventional technique is the bulge test. In the case of the bulge test, a membrane is supported at its edges, and the response is a plot of deflection verses applied pressure.

There are other well-established devices that are commercially available for performing mechanical characterization. One is the mechanical testing system, such as MTS or Instron. The mechanical testing system works with a large load, having sub-Newton sensitivity and large displacement while providing sub-micrometer resolution. Another type of device for performing mechanical characterization is a conventional atomic force microscopy (AFM), working in the nano-indentation mode. AFM works with very gentle load, ranging from 1-100 nano-Newtons (nN), and fine displacement, ranging from 1-1000 nanometers. One drawback is that using both MTS and AFM, there is a big gap between the measurements that can be taken, both in terms of force and displacement. Unfortunately, this gap is the exactly the region that MEMS devices operate in. Recently, many efforts have tried to expand these two well-established methods into this region. For example, efforts have included changing cantilevers and tips and replacing positioners of the AFM or replacing driving motors with piezo-actuators and changing the loading frame and load cell of the MTS. However these efforts have had limited success. Therefore, there is a need for a completely new technique for studying the mechanical response of structures with small dimensions.

In addition, both the MTS and AFM (when in nano-indentation mode) are inherently displacement controlled: i.e., they impose a fixed displacement and measure the load. However, given the fragile nature of MEMS structures and the nonlinear features of active materials, it is possible to have sudden load increases and failure under displacement control. Therefore, it is desirable to test fragile materials, such as MEMS structures, in a load-control device (i.e., a device that imposes a force and measures the displacement). The conventional MTS and the AFM (when in nano-indentation mode) can be adapted for load control by means of a feedback loop. But there are severe limits on the response time, and this is effective only for quasi-static testing, and not for dynamic testing. Further, the resulting transients from displacement control can lead to large undesired loads in such devices. Therefore, there is a real need for a new technique that is inherently load controlled.

BRIEF SUMMARY OF THE INVENTION

The present invention provides a system and a method that overcomes the aforementioned limitations and fills the aforementioned needs by providing a method and apparatus for measuring the mechanical response of MEMS.

In one aspect, the present invention provides a measurement system comprising: a loading sub-system comprising: a substantially rigid beam placed on a pivot, the pivot dividing the substantially rigid beam into a first portion and a second portion; a loading tip connected with the first portion of the substantially rigid beam; and a load-control sub-system, a portion of the load-control sub-system connected with the second portion of the substantially rigid beam; and a displacement measurement sub-system for measuring a displacement of the substantially rigid beam.

In another aspect, the load-control system comprises: a first magnet connected with the second portion of the substantially rigid beam; and a second magnet located at a distance away from the first magnet, such that the combination of the first magnet and the second magnet may cause a force on the substantially rigid beam.

In yet another aspect, the displacement measurement sub-system comprises: a mirror connected with the first portion of the substantially rigid beam; a laser for applying a beam to the mirror, and thus generating a reflected beam; and a position sensitive detector positioned to receive the reflected beam.

In a further aspect, the displacement measurement sub-system further comprises an oscilloscope connected with the position sensitive detector for measuring a response of the position sensitive detector.

In another aspect, the system further comprises an observation sub-system, wherein the observation sub-system comprises: a microscope positioned over the first portion of the substantially rigid beam for observing a sample.

In yet another aspect, the observation sub-system further comprises: a charge-coupled device camera connected with the microscope; and a computer connected with the charge coupled device camera, wherein the charge coupled device camera and the computer can record images produced by the microscope.

In still a further aspect, the system further comprises an optical table for supporting the loading sub-system and the displacement measurement sub-system.

In another aspect, the load-control system comprises a first electrically charged object connected with the second portion of the substantially rigid beam; and a second electrically charged object located at a vertical distance away from the first electrically charged object, such that the combination of the first electrically charged object and the second electrically charged object may cause a force on the substantially rigid beam.

In yet another aspect, the load-control system comprises: a first magnet connected with the second portion of the substantially rigid beam; and a solenoid located at a distance away from the first magnet, such that a force on the substantially rigid beam is varied by changing a current passed through the solenoid.

In a still further aspect, the displacement measurement sub-system comprises: an interferometer, wherein a mirror of the interferometer is connected with the first portion of the substantially rigid beam.

In yet another aspect, wherein the displacement measurement sub-system comprises: a microscope fitted with an interference objective for observing a sample.

Another aspect of the present invention is a method of measuring mechanical response comprising acts of: applying a loading force to a sample through a loading tip of a substantially rigid beam on a pivot; and measuring a resulting displacement of the loading tip to determine a mechanical response of the sample to the force.

In a further aspect, the act of applying a loading force comprises an act of: causing the loading force through a combination of two magnets.

In a still further aspect, the act of measuring comprises acts of: applying a laser beam to a mirror connected with the substantially rigid beam; and detecting a laser beam reflected off of the mirror.

In yet another aspect, the act of detecting further comprises an act of utilizing an oscilloscope to detect the mechanical response of the sample.

In another aspect, the method further comprises act of observing the sample as the force is applied by the loading tip.

In a further aspect, wherein the act of observing further comprises an act of: recording images produced by the microscope by a charge-coupled device camera.

In still another aspect, the act of applying a loading force comprises an act of: causing the loading force through a combination the two electrically charged objects.

In another aspect, the act of applying a loading force comprises an act of: causing the loading force through a combination of a first magnet connected with the substantially rigid beam and a solenoid located at a distance away from the first magnet, such that a force on the substantially rigid beam is varied by changing a current passed through the solenoid.

In still a further aspect, the act of applying a loading force comprises an act of: causing the loading force through a combination the two electrically charged objects.

In a further aspect, the act of measuring comprises an act of: utilizing an interferometer with one mirror attached with the substantially rigid beam.

Yet still a further aspect of the present invention is a system comprising: a loading sub-system comprising: a substantially rigid beam placed on a pivot, the pivot dividing the substantially rigid beam into a first portion and a second portion; a loading tip connected with the first portion of the substantially rigid beam; and a load-control sub-system comprising: a first magnet connected with the second portion of the substantially rigid beam; and a second magnet located at a vertical distance away from the first magnet, such that the combination of the first magnet and the second magnet may cause a force on the substantially rigid beam; and a displacement measurement sub-system comprising: a mirror connected with the first portion of the substantially rigid beam; a laser positioned to apply a beam to the mirror, generating a reflected beam; and a position sensitive detector positioned to receive the reflected beam.

BRIEF DESCRIPTION OF THE DRAWNGS

The objects, features and advantages of the present invention will be apparent from the following detailed descriptions of the preferred aspects of the invention in conjunction with reference to the following drawings, where:

DETAILED DESCRIPTION

Figure 1:
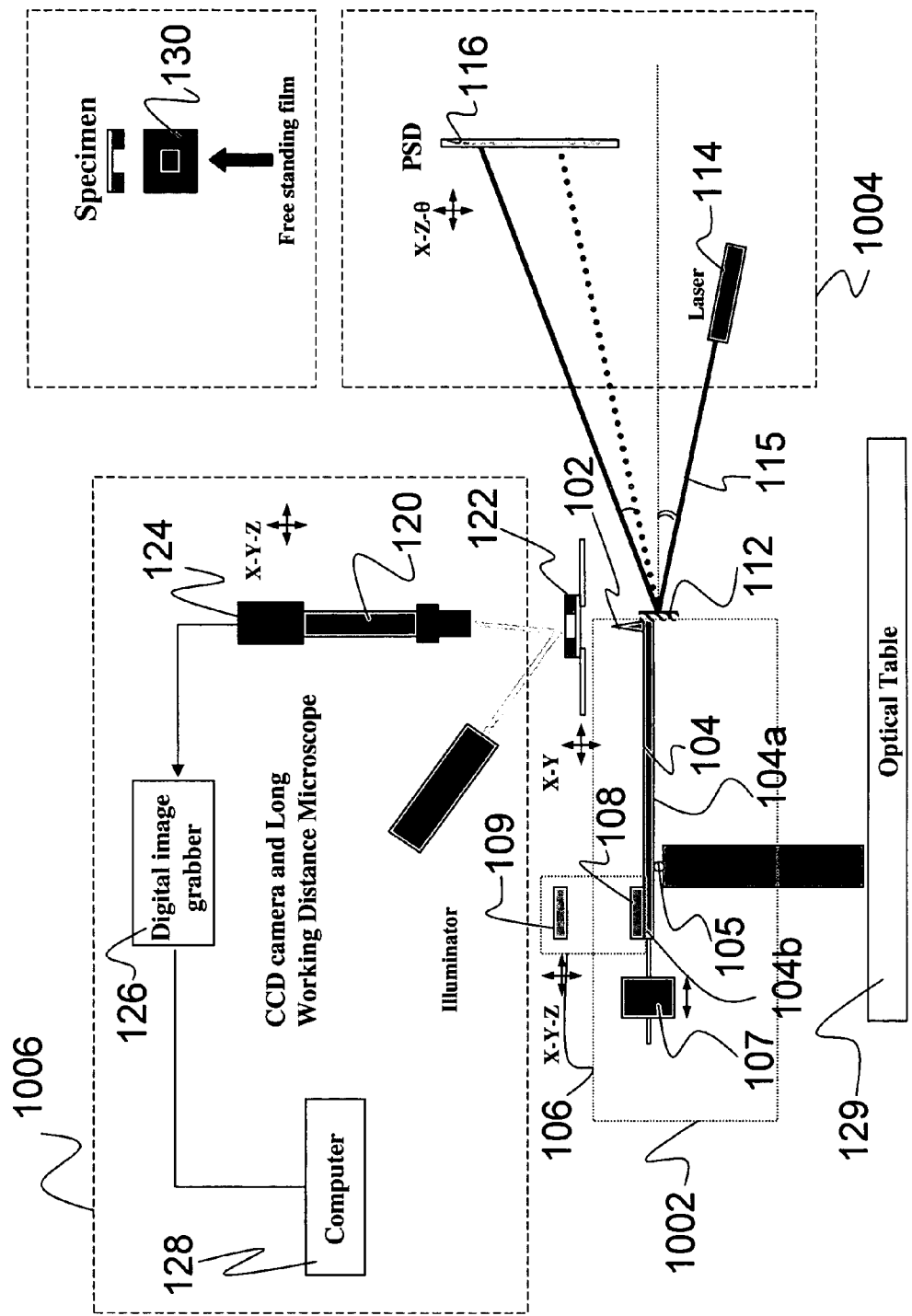
FIG. 1 depicts one embodiment of a system for measuring the response of a sample in accordance with the present invention.

The present invention relates to the field of measuring the mechanical response of micro-electro-mechanical systems and other small mechanical structures. More specifically, the present invention pertains to a method and apparatus that allows the direct control of the load applied to a micro-electro-mechanical system in order to measure the mechanical response. The following description, taken in conjunction with the referenced drawings, is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein. Furthermore it should be noted that, unless explicitly stated otherwise, the figures included herein are illustrated diagrammatically and without any specific scale, as they are provided as qualitative illustrations of the concept of the present invention.

One skilled in the art will appreciate that the scope of the terms is intended to be construed with reference to this disclosure as a whole and with respect to the claims below. In order to provide a working frame of reference, a brief introduction is provided in the form of a narrative description of the present invention to give a conceptual understanding prior to developing the specific details. The introduction is followed by a detailed description of the elements is provided in order to enable the reader to make and use the various embodiments of the invention without involving extensive experimentation.

(1) Introduction

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

(2) System Overview

In one embodiment, a system and method is capable of applying a point load or line load under either load control or displacement control, having a sensitivity of better than one micro-Newton. The system and method is capable of measuring either the quasi-static mechanical response or the dynamic mechanical response of a sample under a combination of constant load and dynamic external signals, such as an electric field, magnetic field, or temperature changes. One skilled in the art will appreciate that the measurement of the response under dynamic external signals is important for MEMS, which may involve actuators or sensor made of active materials.

Generally, a sample is placed above a loading tip. The loading tip is attached with a substantially rigid beam at one end. The loading tip is moved toward the sample by controlling the movement of the substantially rigid beam. Once the loading tip establishes contact with the sample, the force applied on one end of the substantially rigid beam is proportional to that being applied to the sample. The displacement of the loading tip, as it is applied to the sample, is measured via a displacement measurement system. Optionally, an observation system may also be used to view the effects of the force upon the sample.

FIG. 1 depicts one embodiment of a system for measuring the response of a sample. The system comprises a loading sub-system 1002, a displacement measurement sub-system 1004 and an optional observation sub-system 1006.

In one embodiment, the loading sub-system 1002 comprises a substantially rigid cantilever comprising a substantially rigid beam 104 placed on a pivot 105. The pivot 105 divides the substantially rigid beam 104 into a first portion 104a and a second portion 104b. The loading sub-system 1002 further comprises a loading tip 102 connected with the first portion 104a of the substantially rigid beam 104, and a load-control sub-system 106. This load-control sub-system 106 controls the force that is applied to the substantially rigid beam 104 and through it to the loading tip 102. The position of the loading tip 102 is measured via a non-contact displacement measurement sub-system 1004. One skilled in the art will understand that substantially rigid means devoid of flexibility, wherein a substantially rigid beam does not bend in a measurable manner which will interfere with the system.

One skilled in the art will appreciate that there are several ways to implement the load-control sub-system 106. In one embodiment, the force applied to the substantially rigid beam 104 is controlled by changing the distance between magnets 108 and 109. One of the magnets 108 is attached to the second portion 104b of the substantially rigid beam 104. The other magnet 109 is attached to an external position which is capable of moving up and down.

In another embodiment, the load-control sub-system 106 may be implemented using an electric-field. In this embodiment, the two magnets 108 and 109 would be replaced with electrically charged objects. These electrically charged objects can be of any shape (plates, cylinders, etc.), and can be made by any material that can hold an electric charge. The force is controlled by either changing the distance between the electrically charged objects or by changing the charge on one of the charged objects.

In yet another embodiment, the load-control sub-system 106 may be implemented using an electromagnetic field. In this embodiment, one magnet 109 is replaced with a solenoid, while retaining the other magnet 108. The force can be changed by controlling the electric current that flows through the solenoid. One skilled in the art will appreciate that the solenoid can be used to replace the magnet 108 instead of magnet 109.

Figure 2:
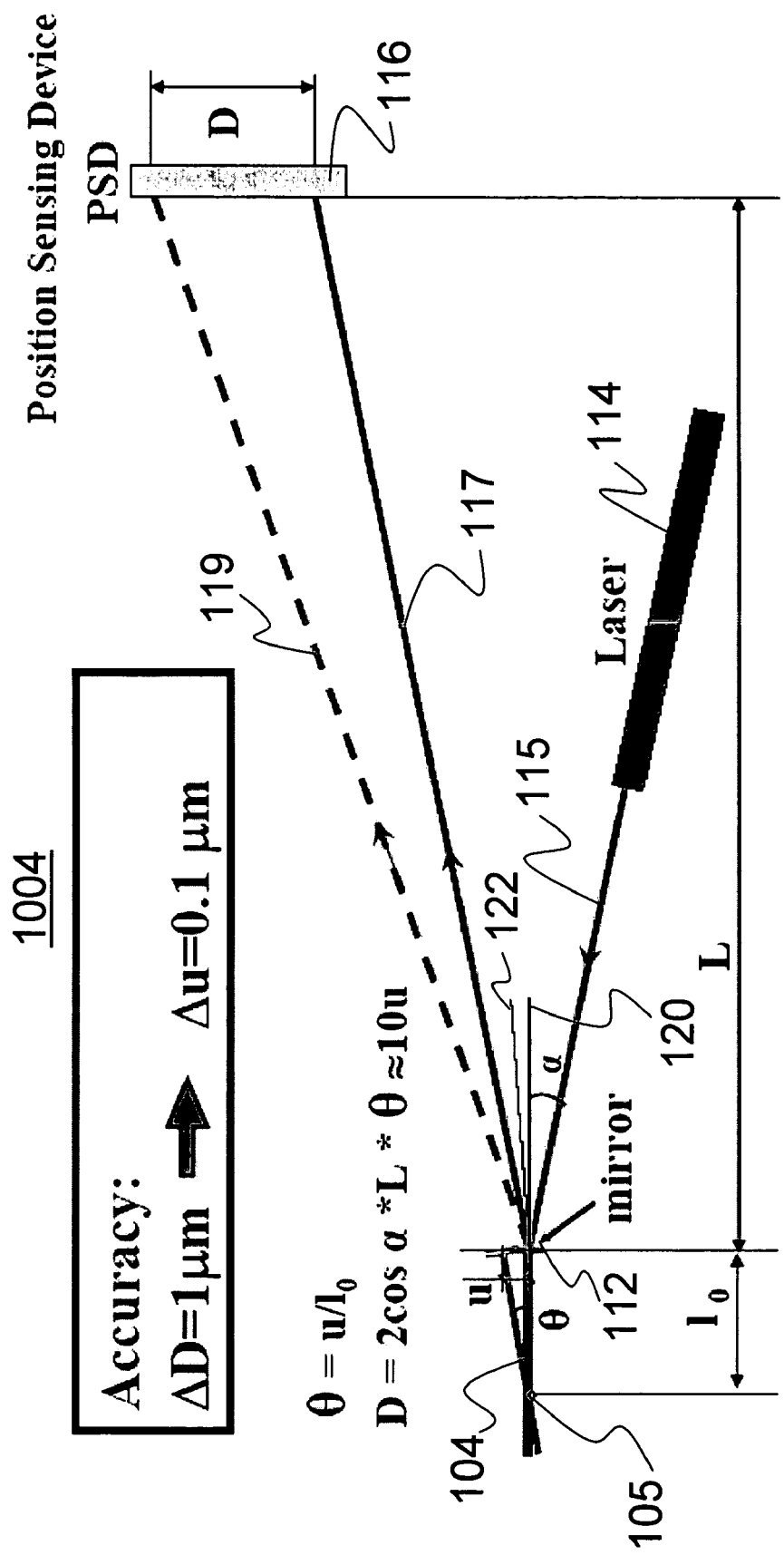
FIG. 2 depicts the geometry of one embodiment of a non-contact displacement measurement system in accordance with the present invention.

As shown in FIG. 1, in one embodiment, the non-contact displacement measurement system 1004 comprises a mirror 112, a laser 114, and a position sensitive detector (PSD) 116. The mirror 112 is connected with the first portion 104a of the substantially rigid beam 104 having the loading tip 102. One skilled in the art will appreciate that the mirror 112 could be connected with the other portion 104b of the substantially rigid beam 104 and that equations could be used to calculate the ratio of change of one end 104b of the substantially rigid beam 104 to the other end 104a. However, since it is a measurement of the displacement of the loading tip 102 that is desired, the mirror 112 is located on the portion 104a of the substantially rigid beam 104 that has the loading tip 102. As shown in FIGS. 1 and 2, the laser 114 and the PSD 116 are located a distance away from the substantially rigid beam 104. The laser 114 emits a laser beam 115, which is reflected from the mirror 112 and redirected toward the PSD 116. The signal from the PSD 116 is monitored. In one embodiment, the signal from the PSD 116 is monitored using an oscilloscope 118.

FIG. 2 depicts the geometry of the non-contact displacement measurement system 1004. Only a portion of the substantially rigid beam 104 is shown rotating around the pivot 105. The angle θ represents the angle through which the substantially rigid beam 104 is moved from a first position 120 to a second position 122. The angle α is the angle at which the laser beam 115 is incident to the mirror 112. The distance from the pivot 105 to the mirror 112 is referred to as $l_0$. The distance from the mirror 112 to the PSD 116 is L. The vertical component of the movement of the substantially rigid beam 104 is referred to as u. The angle θ (in radians) is defined by $u/l_0$. The solid line 117 is the reflection of the laser beam 115 after it hits the mirror 112 when the substantially rigid beam 112 is in the first position 120. The dotted line 119 is the reflection of the laser beam 115 after it hits the mirror 112 when the substantially rigid beam is in the second position 122. D is a distance between where the reflected laser beam hits the PSD 116 when the substantially rigid beam 104 is in the first position 120, and where the reflected laser beam hits the PSD 116 when the substantially rigid beam 104 is in the second position 122. D is related to the other variables by the equation D=2 cos $(\alpha)$*L*$\theta$.

In another embodiment, the non-contact displacement measurement sub-system 1004 can be replaced by an interferometer. In this embodiment, one of the mirrors of the interferometer is attached with the first portion of the substantially rigid beam 104. The other mirror, and associated beam splitters can be attached at a distance away from the substantially rigid beam 104.

In yet another embodiment, the non-contact displacement measurement sub-system 1004 can be replaced by a Michelson interferometer that directly measures the displacement of the sample. In this embodiment, the surface of the sample may be observed through a microscope 120 fitted with a Michelson double beam interference objective (e.g., CF M Plan TI 5x, available from Nikon, Japan). One skilled in the art will appreciate that the Michelson double beam interference objective includes a beam splitter and a reference mirror. The displacement is obtained by counting the number of fringes.

Additionally, as previously discussed regarding FIG. 1, an optional observation sub-system 1006 may be added. The optional observation sub-system 106 may comprise a long working distance optical microscope 120 used to monitor the alignment of a sample 122 with respect to the loading tip 102. The optical microscope 120 may be placed to view a side of the sample opposite the loading tip 102. One skilled in the art will appreciate that all controlling and monitoring components, i.e. the other magnet 109, the laser 114, the PSD 116, and the microscope 120 are described as isolated from the substantially rigid beam 104. While this isolation is not necessary, it significantly reduces the vibrations and noises, which enables more accurate measurements when dealing with very fragile structures.

(3) System Details

In one embodiment, the substantially rigid beam 104 is made of aluminum (e.g. AL2024), or another non-magnetized material. In an embodiment where the position control sub-system 106 comprises magnets, the non-magnetized material prevents the substantially rigid beam 104 from being affected by the magnetic field generated by the magnets 108 and 109. In this embodiment, exemplary but non-limiting, dimensions of the substantially rigid beam 104 are six inches long by one inch wide, with a thickness of 0.175 inches.

The loading tip 102 can be chosen from a wide variety of commercially available tips, such as those by Carbide Probes Inc. (Dayton, Ohio). Point loads can be applied, for example, by a Ruby ball tip (model #265-.3R), carbide ball tips (model #265-.3), or a conical ceramic tip with a diameter of 300 microns. Line loads can be applied by a chisel-shaped ceramic tip made of carbide (product numbers 20040731, 20040801-0059, 20040801-0035), with a wedge length of 300 microns, 150 microns, and 80 microns, respectively.

The magnets 108 and 109 can be chosen from a wide variety of commercially available magnets, such as those by McMaster-Carr (Santa Fe Springs, Calif.) (product no. 58585K61). In one embodiment, the magnets are pressure-formed Neodymium, being one inch square having a thickness of three-eights of an inch.

The laser 114 may be chosen from a wide variety of commercially available lasers. In one embodiment, the laser is a ten milliwatt helium-neon (HeNe) laser, from Mells Griot (Carlesbad, Calif.) (25LHP991-249). A neutral density filter from Ealing Catalog, Inc. (product # 36-4687, Rocklin, Calif.) may be used to avoid saturation of the PSD sensor.

The mirror 112 may be chosen from a wide variety of commercially available mirrors. In one embodiment, the mirror is one-half inch square with a high-energy coating for 632.8 mircon length, available from Mells Griot (02MLQ001/003).

The PSD 116 can be selected from a wide range of commercially available PSDs. In one embodiment, the PSD sensor is from Hamamatsu Co. (Hamamatsu City, Japan) (S3979). The driving circuit is also available from Hamamatsu Co., model number C3683-01. The typical precision of a PSD is about one micrometer, and the driving circuit has a one millisecond response time. A resolution of 0.1 micrometers can be obtained in the measurement of the tip displacement if the distance between the mirror and the PSD is 10 times larger than the distance between the loading tip 102 and the pivot 105.

The optional microscope 120 can be selected from a wide range of commercially available microscopes. In one embodiment, the microscope has two objectives. A first objective is a 1x Tool Makers Objective Lens (product #70811) provided by A.G. Heinze Inc. (manufactured by Nikon, Japan), having a working distance of 79 millimeters. The second objective is a 10x Objective Lens (product # 70811) provided by A.G. Heinze Inc., also manufactured by Nikon, having a working distance of 49.5 millimeters.

One skilled in the art will appreciate that other peripherals may be added to the system in order to capture the observations of applying a load to the samples. For example, a charge-coupled device (CCD) camera 124 may be used to capture observations. Examples of a CCD camera include the XC-75 monochrome video camera by Sony Corp. (Tokyo, Japan), and the CV-3200N color CCD camera with a one-half inch Exview HAD™ IT color CCD sensor from JAI America Inc. (Laguna Hills, Calif.).

Other peripherals may include digital image grabbers 126 and software located on a computer 128, such as PIXCI SV4, XCLIBV2.2-DWT-U, and XCAPLITE-WIN-V2.2 from EPIX Inc. (Buffalo Grove, Ill.). The digital image grabbers and software allow the capture of real-time pictures up to 30 frames-per-second.

One skilled in the art will appreciate that a flat, stable surface increases the measurement accuracy of the system and isolates vibrations. Thus, in one embodiment, the system is supported by an optical table 129 (RS3000-35-12) and supports (PL-2000-423.5) from Newport Co. (Irvine, Calif.).

One skilled in the art will further appreciate that samples with known characteristics are typically utilized to test any new system. To this end, many tests were performed using free-standing, silicon nitride, thin films. The films had transmission electron microscopy (TEM) windows (4122SN-BA), available from SPI Supplies (Westchester, Pa.). The films are 0.46 millimeter square with 100 nanometer thick free-standing, thin films on 200 micron thick silicon supports.

(4) Calibration

One skilled in the art will appreciate that there are many ways in which the system can be aligned and calibrated. The following description is meant as an example only and is not intended to limit the various mechanisms that can be used to calibrate the system.

In order to calibrate the system, one magnet 109 is aligned in the horizontal plane, using an X-Y stage, such that it is situated above the other magnet 108. By aligning the magnets horizontally, a lateral force is prevented from being applied to the substantially rigid beam 104. The distance between the two magnets 108 and 109 is large enough such that the magnetic force is negligible. Next, the substantially rigid beam 104 is balanced on the pivot 105 by moving a weight 107 along the axis of the substantially rigid beam 104. One skilled in the art will appreciate that there are several ways to balance a beam on a pivot. After balancing the substantially rigid beam 104, the substantially rigid beam 104 is moved a bit out of balance such that the end having the loading tip 102 extends away from the sample. The unbalanced force is approximately equal to the desired range of load in the experiments. One magnet 109 is moved toward the other magnet 108 until the substantially rigid beam 104 is in balance again, and the loading tip 102 is close, but not in contact with, the sample.

Figure 3:
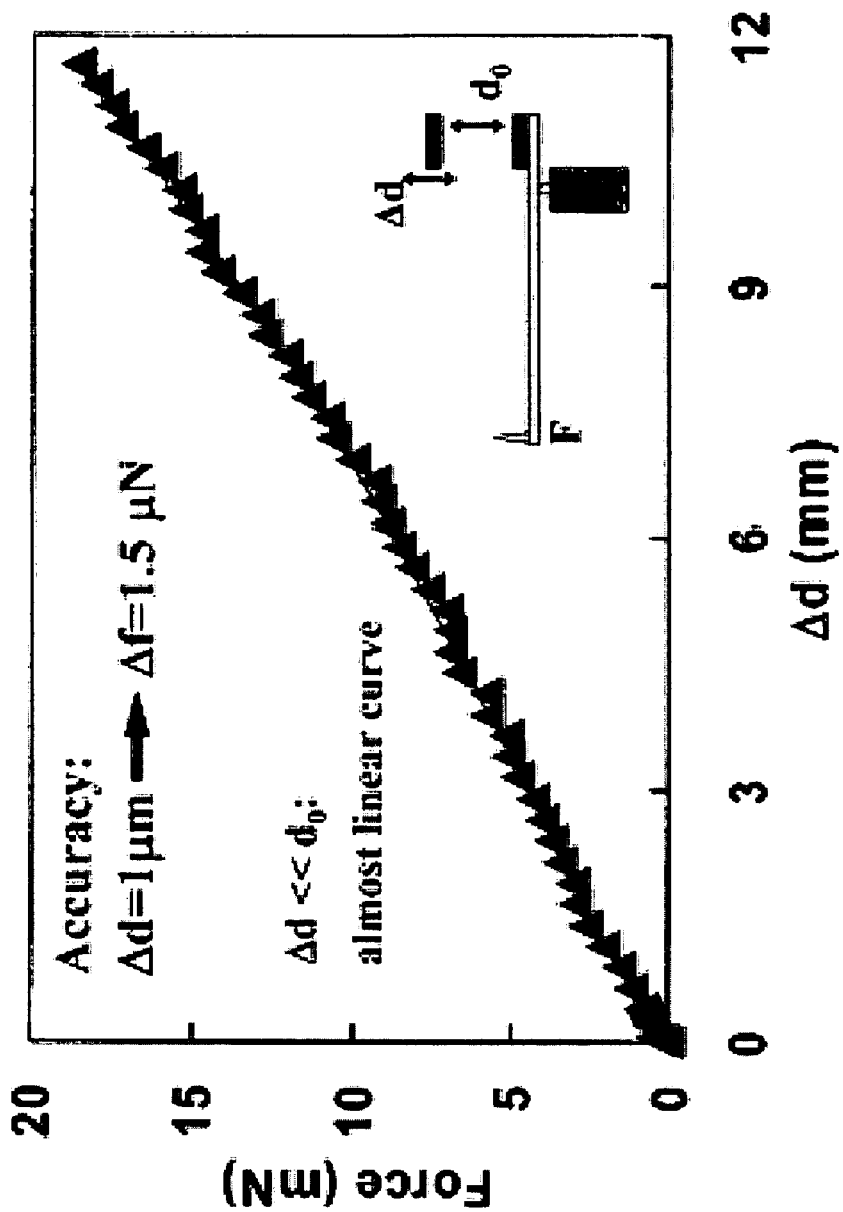
FIG. 3 shows a calibration curve of force as a function of change in distance between magnets in accordance with the present invention.

The laser 114 is turned on and the PSD 116 is moved on a two axes stage until a beam from the laser 114 hits the center of the PSD 116. A device to measure the force (i.e., a load cell) is placed in the sample position. At this point, the loading tip 102 is close, but not in contact with the load cell. One magnet 109 is moved downward in small steps and the position of the loading tip 102 is monitored using the PSD 116 (i.e., via an oscilloscope). As long as the loading tip 102 does not touch the load cell, the displacement of the loading tip 102 is proportional to the displacement of one magnet 109 and the load cell shows zero loads. When the loading tip 102 comes into contact with the load cell, it almost stops moving and the load cell indicates the load. FIG. 3 shows a calibration curve of the force as a function of the change in distance ($\Delta d$) between the magnets 108 and 109. Different calibration curves can be measured for different magnets and different initial distances, $d_o$, between the magnets 108 and 109. An almost linear calibration curve appears if $d_o$ is chosen to be much larger than $\Delta d$. As shown in FIG. 3, a change of $\Delta d$ by one micrometer changes the load by 1.5 micro-Newtons. Thus, load sensitivity in the micro-Newton scale can be obtained by moving one magnet 109 with a simple micro-screw.

Figure 4:
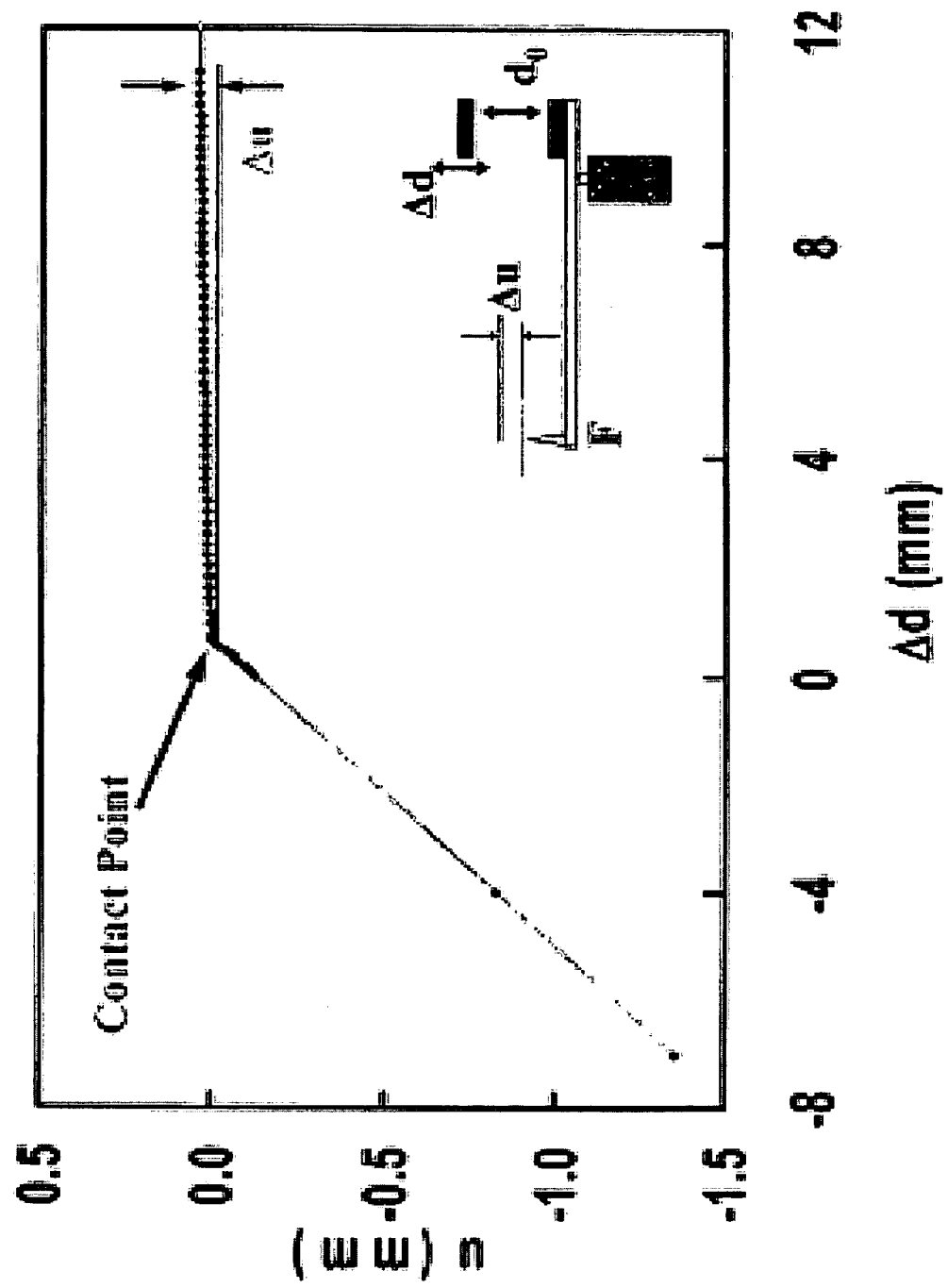
FIG. 4 shows the results when a sample of silicon nitride ($Si_3N_4$) thin released film with a thickness of 100 nanometers is measured in accordance with the present invention.

The loading range and sensitivity, as well as the choice between load or displacement controls, are determined by the strength of the magnets 108 and 109 and their initial distance. If the effective spring constant of the magnetic force (the slope of the calibration curve) is much smaller than the effective spring constant of the sample, then the displacement of the sample ($\Delta u$) is negligible relative to the change in the distance ($\Delta d$) between the magnets 108 and 109. The change in the distance ($\Delta d$) between the magnets 108 and 109 is equal to the displacement ($\Delta z$) of one of the magnets 109. Hence, the force is directly related to $\Delta z$, providing a load control situation. FIG. 4 shows the results when measuring a sample of silicon nitride ($Si_3N_4$) thin released film with a thickness of 100 nanometers. On the other hand, if the effective spring constant of the magnetic force is much larger then the effective spring constant of the sample, then $\Delta u$ is much larger than $\Delta d$. In this case, $\Delta u$ is equal to $\Delta z$, providing a displacement control situation.

(5) Measurements

The following is an example of one way in which this system and method may be used to measure the mechanical response of MEMS. A sample is placed a few millimeters above the loading tip 102. The loading tip 102 is moved upward toward the sample by moving one magnet 109 downward. While moving the loading tip 102 toward the sample, the sample is positioned such that the loading tip 102 will approach a desired point on the sample. During this step, the position of the loading tip 102 is monitored by a signal from the PSD 116, and the contact point is determined by the point where the displacement of the sample ($\Delta u$) compared to the distance ($\Delta d$) between the magnets 108 and 109 is no longer linear, as shown in FIG. 4.

After obtaining contact between the loading tip 102 and the sample, a quasi-static experiment may be performed by increasing the load gradually and recording the displacement of the loading tip 102.

A dynamic experiment in which the mechanical response is measured under a combination of constant load and dynamic external signal, such as an electric field, magnetic field, or temperature change may also be performed. In this case, a fixed load is applied to the sample, and the displacement of the loading tip 102 is measured during the application of the dynamic external signal.

(6) Pressure Embodiment

Figure 5:
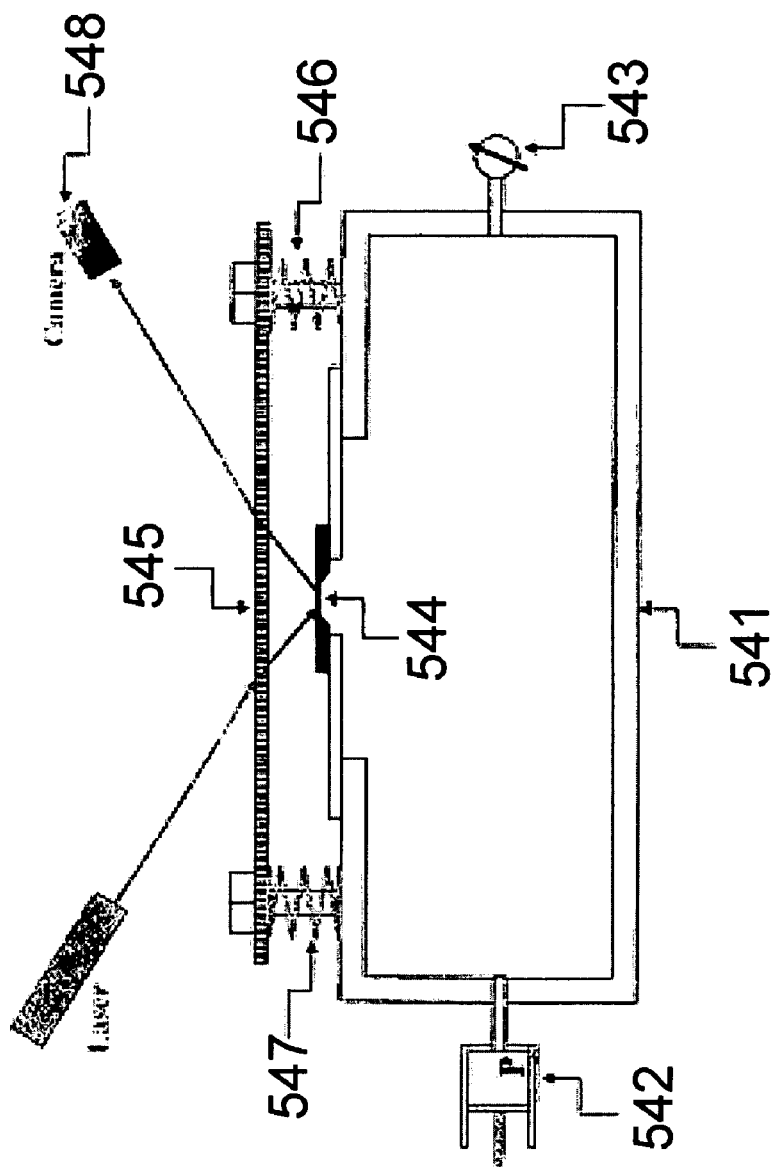
FIG. 5 depicts a second embodiment, which is designed to apply a uniform pressure on a free-standing film or membrane in accordance with the present invention.

A second instrument, which is designed to apply a uniform pressure on a free-standing film or membrane is illustrated in FIG. 5. The second system comprises a small chamber 541, a piston or bellow 542 (to control the pressure), a pressure-meter 543, and an optical system to measure the out-of-plane displacement field of the sample 544.

The dimensions of the small chamber 541 are typically a few inches in each axis, such that it is small enough to be placed under a variety of imaging tools, such as an optical microscope, an AFM, a confocal microscope, an X-ray diffractometer, or a microRaman spectrometer. On the other hand, the small chamber 541 is much larger than the volume which is covered by the sample displacement, such that sample displacements do not change the pressure in the chamber. The bottom of the small chamber 541 is made of glass in order to allow transmission of light in applications in which a transmission microscopy is needed.

Depending on the sample dimensions, the desired pressure in the chamber is typically larger by 0.05 to 5.0 pounds per square inch (psi) than the atmosphere pressure outside the small chamber 541. For this purpose, a small piston or bellow 542 is enough to control the pressure, but the pressure-meter should have good sensitivity (meters with a sensitivity of 0.01 psi are common and commercially available).

The out-of-plane displacement of the sample is measured by a shadow moiré method. An optical grating 545 is placed with a distance of about 10 to 100 micrometers above the sample surface. Before application of the pressure, the grating 545 is aligned to be parallel to the sample surface by means of four screws and springs 546 and 547. The inference of the shadow of the grating on the sample and the grating 545 itself leads to a fringe pattern, which is a measure of the out-of-plane displacement. The interference image is recorded by a digital camera 548 and analyzed after the experiment.

This instrument allows measuring either the quasi-static mechanical response or the dynamic mechanical response under a combination of constant pressure and dynamic external signals, such as electric fields, magnetic fields, or temperature changes. A quasi-static experiment can be performed by increasing the pressure gradually and recording the sample displacement. A dynamic experiment can be performed by setting the pressure on a desired fixed value and measuring the displacement of the sample during the application of a dynamic external signal.

What is claimed is:

1. A measurement system comprising:
   a loading sub-system comprising:

a substantially rigid beam placed on a pivot, the pivot dividing the substantially rigid beam into a first portion and a second portion;

a loading tip being directly connected with the first portion of the substantially rigid beam; and a load-control sub-system, a portion of the load-control sub-system connected with the second portion of the substantially rigid beam; and a displacement measurement sub-system for measuring a displacement of the substantially rigid beam;

wherein the load-control system comprises:

a first magnet connected with the second portion of the substantially rigid beam; and a solenoid located at a distance away from the first magnet, such that a force on the substantially rigid beam is varied by changing a current passed through the solenoid;

wherein the displacement measurement sub-system comprises:

a mirror connected with the first portion of the substantially rigid beam;

a laser for applying a beam to the mirror and thus generating a reflected beam; and a position sensitive detector positioned to receive the reflected beam.

2. The system of claim 1, wherein the displacement measurement sub-system further comprises an oscilloscope connected with the position sensitive detector for measuring a response of the position sensitive detector.

3. The system of claim 2, further comprising an observation sub-system, wherein the observation sub-system comprises:

a microscope positioned over the first portion of the substantially rigid beam for observing a sample.

4. The system of claim 3, wherein the observation sub-system further comprises:

a charge-coupled device camera connected with the microscope; and a computer connected with the charge coupled device camera, wherein the charge coupled device camera and the computer can record images produced by the microscope.

5. The system of claim 4, further comprising an optical table for supporting the loading sub-system and the displacement measurement sub-system.

6. A method of measuring mechanical response comprising acts of:

applying a loading force to a sample through a loading tip being directly connected with a substantially rigid beam on a pivot; and measuring a resulting displacement of the loading tip to determine a mechanical response of the sample to the force;

wherein the act of applying a loading force comprises an act of:

causing the loading force through a combination of a first magnet connected with the substantially rigid beam and a solenoid located at a distance away from the first magnet, such that a force on the substantially rigid beam is varied by changing a current passed through the solenoid;

wherein the act of measuring comprises acts of:

applying a laser beam to a mirror connected with the substantially rigid beam; and detecting a laser beam reflected off of the mirror.

7. The method of claim 6, wherein the act of detecting further comprises an act of utilizing an oscilloscope to detect the mechanical response of the sample.

8. The method of claim 7, further comprising an act of observing the sample as the force is applied by the loading tip.

9. The method of claim 8, wherein the act of observing further comprises an act of:

recording images produced by the microscope by a charge-coupled device camera.

* * * * *